United States Patent
Strang et al.

(10) Patent No.: US 6,887,341 B2
(45) Date of Patent: May 3, 2005

(54) PLASMA PROCESSING APPARATUS FOR SPATIAL CONTROL OF DISSOCIATION AND IONIZATION

(75) Inventors: Eric J. Strang, Chandler, AZ (US); Paul Moroz, Phoenix, AZ (US); Steven T. Fink, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 275 days.

(21) Appl. No.: 10/291,754

(22) Filed: Nov. 12, 2002

(65) Prior Publication Data

US 2003/0094238 A1 May 22, 2003

Related U.S. Application Data

(60) Provisional application No. 60/331,251, filed on Nov. 13, 2001.

(51) Int. Cl.[7] .......................... H01L 21/306; C23F 1/00; C23C 16/00; C23C 16/455
(52) U.S. Cl. ............................ 156/345.48; 156/345.33; 118/715; 118/723.1
(58) Field of Search ............................ 118/715, 723 E, 118/723 I, 723 MW; 156/345.29, 345.41, 345.43, 345.47, 345.48, 345.33, 345.34

(56) References Cited

U.S. PATENT DOCUMENTS

| | | | | | |
|---|---|---|---|---|---|
| RE30,244 | E | * | 4/1980 | Alexander et al. | 118/723 E |
| 4,767,641 | A | * | 8/1988 | Kieser et al. | 427/569 |
| 4,980,204 | A | * | 12/1990 | Fujii et al. | 117/98 |
| 5,113,790 | A | * | 5/1992 | Geisler et al. | 118/723 E |
| 5,399,254 | A | * | 3/1995 | Geisler et al. | 204/298.31 |
| 5,534,751 | A | * | 7/1996 | Lenz et al. | 315/111.71 |
| 5,578,130 | A | * | 11/1996 | Hayashi et al. | 118/723 E |
| 5,803,973 | A | * | 9/1998 | Szczyrbowski et al. | 118/723 ER |
| 5,824,605 | A | * | 10/1998 | Chen et al. | 438/729 |
| 5,983,828 | A | * | 11/1999 | Savas | 118/723 I |
| 6,008,130 | A | * | 12/1999 | Henderson et al. | 438/710 |
| 6,305,315 | B1 | * | 10/2001 | Suzuki et al. | 118/723 MW |
| 6,320,321 | B2 | * | 11/2001 | Ogura et al. | 315/111.81 |
| 6,340,499 | B1 | * | 1/2002 | Sandhu et al. | 427/248.1 |
| 6,417,111 | B2 | * | 7/2002 | Nishikawa et al. | 438/710 |
| 6,451,161 | B1 | * | 9/2002 | Jeng et al. | 156/345.48 |
| 6,508,199 | B1 | * | 1/2003 | Oyabu | 118/723 E |
| 6,539,890 | B1 | * | 4/2003 | Felts | 118/723 E |
| 6,620,290 | B2 | * | 9/2003 | Yamamoto et al. | 156/345.41 |
| 6,706,142 | B2 | * | 3/2004 | Savas et al. | 156/345.48 |
| 2001/0015261 | A1 | * | 8/2001 | Kobayashi et al. | 156/345 |
| 2002/0121345 | A1 | * | 9/2002 | Chen et al. | 156/345.48 |
| 2003/0094238 | A1 | * | 5/2003 | Strang et al. | 156/345.48 |
| 2003/0106643 | A1 | * | 6/2003 | Tabuchi et al. | 156/345.35 |

* cited by examiner

*Primary Examiner*—Jeffrie R. Lund
(74) *Attorney, Agent, or Firm*—Pillsbury Winthrop LLP

(57) ABSTRACT

A plasma processing apparatus for spatial control of dissociation and ionization and a method for controlling the dissociation and ionization in the plasma. An aspect of the present invention provides a plasma processing apparatus for spatial control of dissociation and ionization includes a process chamber, a plasma generating system configured and arranged to produce a plasma in the process chamber, a substrate holder configured to hold a substrate during substrate processing, a gas source configured to introduce gases into the process chamber, a pressure-control system for maintaining a selected pressure within the process chamber, and, a plurality of partitions dividing the internal volume of the process chamber into one or more spatial zones. These partitions extend from a wall of the process chamber toward said substrate holder.

13 Claims, 4 Drawing Sheets

US 6,887,341 B2

PLASMA PROCESSING APPARATUS FOR SPATIAL CONTROL OF DISSOCIATION AND IONIZATION

This application is based on and derives the benefit of U.S. Provisional Application No. 60/331,251 filed Nov. 13, 2001, the contents of which are incorporated herein in their entirety by reference.

BACKGROUND

1. Field of Invention

The invention relates to plasma processing apparatus and more particularly, to a plasma processing apparatus including structure providing spatial control.

2. Discussion of Related Art

Plasma processing systems are used in the manufacture and processing of semiconductors, integrated circuits, displays and other devices or materials, to both remove material from or to deposit material on a substrate such as a semiconductor substrate.

Increasing miniaturization of technology increases the demand for improved resolution in design features with increasing complexity and higher aspect ratios. In order to achieve these, improved process uniformity may be beneficial. In plasma processing systems, one factor affecting the degree of etch or deposition uniformity is the spatial uniformity of the plasma density above the substrate.

SUMMARY

This invention pertains to a plasma processing apparatus for spatial control of dissociation and ionization and a method for improving plasma characteristics by controlling the dissociation and ionization in the plasma.

An aspect of the present invention provides a plasma processing apparatus for spatial control of dissociation and ionization including a process chamber, a plasma generating system configured and arranged to produce a plasma in the process chamber, a substrate holder configured to hold a substrate during substrate processing, a gas source configured to introduce gases into the process chamber, a pressure-control system for maintaining a selected pressure within the process chamber, and a plurality of partitions dividing the internal volume of the process chamber into one or more spatial zones. These partitions extend from a wall of the process chamber toward said substrate holder.

Another aspect of the invention is to provide a method for controlling the dissociation and ionization in a plasma. The method includes: disposing a substrate material in a process chamber, providing a flow of precursor gas into the process chamber, forming a plasma from said precursor gas in a plasma volume within the process chamber, and controlling radical and ion formation in said plasma above said substrate with a plurality of partitions extending from a wall of said process chamber toward said substrate.

DETAILED DESCRIPTION OF SEVERAL EMBODIMENTS OF THE INVENTION

Figure 1:
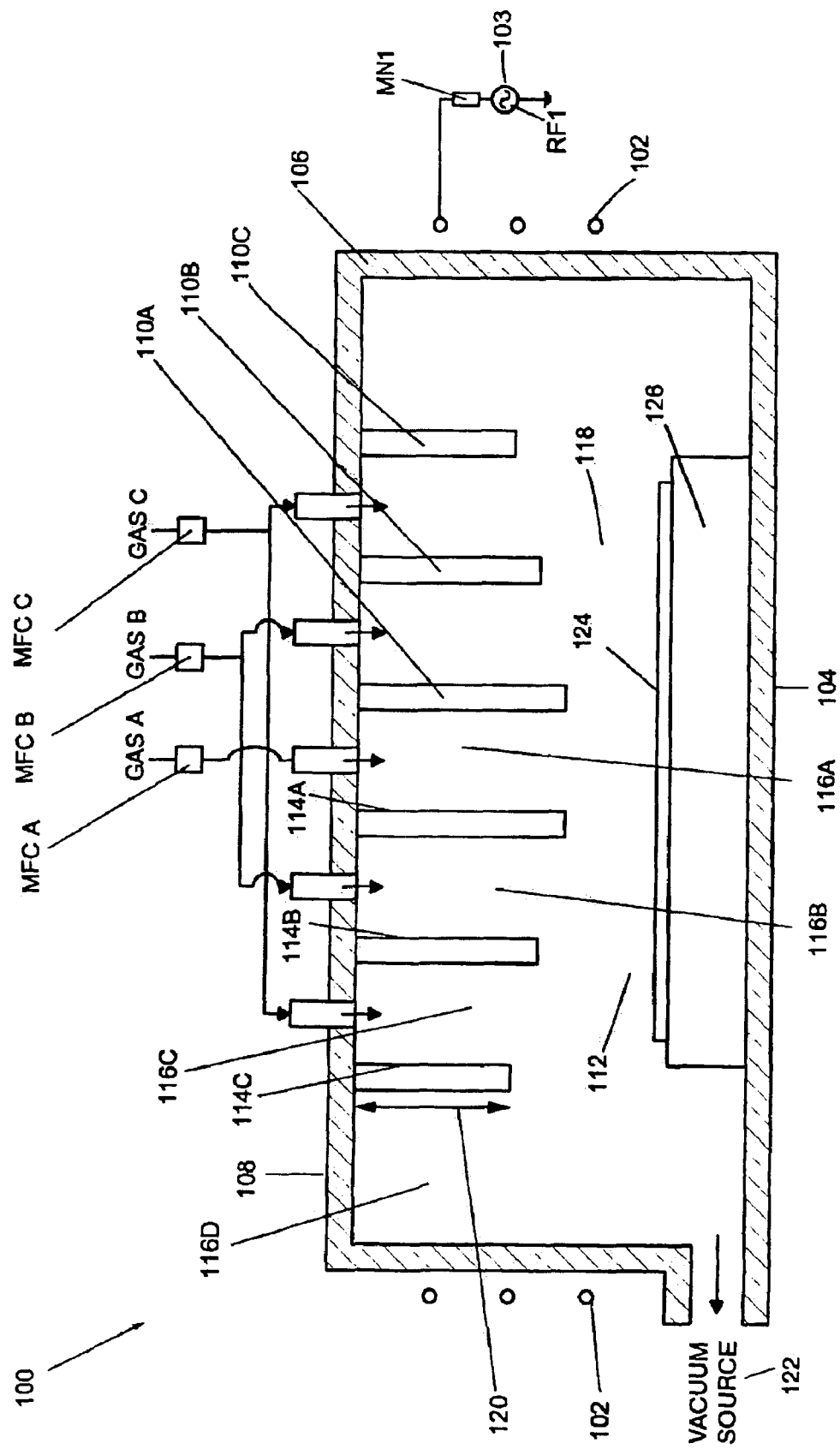
FIG. 1 is a schematic representation of a plasma processing apparatus according to one embodiment of the present invention.

In the following description, in order to facilitate a thorough understanding of the invention and for purposes of explanation and not limitation, specific details are set forth such as particular geometry of the process chamber and use of gases, radio-frequency generating techniques, etc. However, the invention may be practiced in other embodiments that depart from these specific details. The term plasma is used in its broadest definition as being a mixture of electrons, negative and positive ions as well as neutral species such as atoms, molecules and radicals. Throughout the description species in the plasma are referred to as radicals, molecules, electrons or ions. In the drawings, like objects have like reference numbers.

In order to achieve state-of-the art oxide etch performance and meet the requirements (including for example etch rate, sidewall profile, etc.) for most oxide etch processes (such as high aspect ratio contact etch processes and self-align contact etch processes), optimization of the plasma chemistry to form specific etch reactants is suggested. For instance, to over simplify a complex chemical process, it is believed that a proper balance between polymers such as carbon containing species, e.g., $CF$, $CF_2$ and $CF_3$, and other reactive species such as fluorine radical is one important parameter. Precursor gases for the fluorine chemistry can be for example fluorocarbon molecules, such as $CF_4$, $C_2F_6$, $C_4F_8$, etc. Argon can be added as a diluent and/or a mechanism to provide energy to catalyze surface chemistry via ion bombardment. Carbon polymer with low fluorine content can be produced in order to form protective films over non-oxide surfaces, such as silicon nitride (SiN) or poly-Si, while still permitting oxide etch. However, too much $C_xF_y$ radical species can inhibit the etching due to polymer accumulation. On the other hand, excessive fluorine radical formation can lead to poor etch selectivity of oxide-to-silicon or SiN. Fluorine is known to readily etch both of these materials. Therefore, several etch parameters including etch selectivity (i.e., oxide-to-silicon), etch rate, sidewall profile, etc. are sensitively determined by the dissociation condition.

FIG. 1 shows a schematic representation of a plasma processing apparatus 100, according to a first embodiment of the present invention, comprising an inductive coil 102 wound around a chamber body 104. A radio-frequency (RF) field, generated with RF generator 103 is coupled to a plasma through process chamber 104. In the present embodiment, we describe and illustrate the chamber as having a cylindrical shape. However, it is understood that other shapes are possible such as, but not limited to, rectangular or polygonal shape.

The inductive coil 102 may be housed within a conductive enclosure except for the dielectric window 106 which may be fabricated of a dielectric material such as quartz or alumina, in order to permit the coupling of the RF field. Additionally, a grounded, slotted electrostatic shield (Faraday shield) can be inserted between inductive coil 102 and dielectric window 106 to minimize capacitive coupling between inductive coil 102 and plasma. Moreover, RF power from a RF generator can be coupled to coil 102 through an impedance match network to maximize the transfer of power to the plasma. A circular upper wall 108 serves as a cover plate for the vacuum chamber and from the upper wall 108 are appended partitions which, in this embodiment, are concentric cylinders 110A, 110B, 110C, each extending a pre-specified depth into the plasma region 112. It will be understood, however, that alternative shapes as well as configurations are possible. For the sake of clarity three cylinders are represented in FIG. 1, however, it is understood any number of concentric cylinders can be used. As shown in FIG. 1, three concentric cylinders 110A, 110B, 110C, with cylindrical walls 114A, 114B and 114C extend from the upper wall into the plasma, hence, defining four regions, namely, regions 116A, 116B, 116C, and 116D. The concentric walls 114A, 114B and 114C may be fabricated from a dielectric such as, for example, quartz and the wall thickness of the cylinder may vary with length. Moreover, the ends of cylindrical walls 114A, 114B and 114C can be rounded in shape. For instance, the wall thickness may decrease with length such that each annular region increases in its cross-sectional area as one approaches the wafer. The set of concentric cylinders 110A, 110B, 110C impedes the transport of charged species, throughout the processing space 118 and therefore, they partition the plasma region 112 into four regions 116A, 116B, 116C, and 116D. This zoning of process space allows for spatial control of the plasma chemistry by varying the length 120 to which each cylindrical wall extends into the processing space 118. As shown in FIG. 1, the length of the cylindrical walls increases radially inwardly (i.e., the length of cylindrical wall 114A is greater than the length of cylindrical wall 114B which in turn is greater than the length of cylindrical wall 114C). In general, in inductively coupled plasma sources, the plasma density varies over the area above the substrate and, therefore, it is also observed that the dissociation (and reactive chemistry) may, for example, be different at the center than at the edge of the substrate. In order to homogenize the plasma density above the substrate 124, the concentric cylinders are arranged to impede transport near the center and therefore aid in reducing the plasma density relative to the outer edge of the wafer and maintain a similar reactive chemistry. Moreover, this arrangement can also improve electric field and plasma uniformity through the whole area of substrate 124 by compensating for the RF skin effect that otherwise might decrease RF electric field in the areas closer to the center of the substrate. Additionally, this arrangement may also allow decreasing the species residence time and thus improve plasma flow and gas pumping. Each region, 116A, 116B, 116C, and 116D is for example, independently fed with precursor gas flow rate and species composition. In the embodiment shown in FIG. 1, three sources A, B and C of feed gas are used. Gas source A controlled by valve MFC-A feeds region 116A, gas source B controlled by valve MFC-B feeds region 116B and gas source C controlled by valve MFC-C feeds region 116C. This configuration allows for a better control of the plasma in each region by varying the pressure and/or the composition of the feed gas in each of the regions 116A, 116B, 116C, and 116D. Of course, all regions can be fed the same gas mix, perhaps from the same source.

In an alternate embodiment, the cross-sectional geometry of the cylindrical walls 114A, 114B and 114C is noncircular, i.e. rectangular, triangular, multi-sided shape, etc. In an alternate embodiment, at least one cylindrical wall 114A–C comprises one or more panels, plates or planes. As yet another alternative, the walls can be of the same length or can decrease in length toward the center of the chamber.

In a particular embodiment, a mixture of $C_4F_8$, oxygen, and argon is used as the feed gas. The residual pressure within the chamber is maintained in the interval 1 to 1000 millitorr, or between 5 and 50 mtorr, depending on the particular process. The excess gases are evacuated with vacuum system 122. The RF generator has a power of 1 to 5 KW operating at a frequency between 10 to 100 MHz. The RF source creates a plasma which causes the precursor gases to dissociate and ionize and thus create among other species radicals such as $CF_2$ and $CF_3$. For etching an oxide layer, a plasma may be populated with a high concentration of $CF_2$ and $CF_3$ radicals as compared to F, CF and other species. The radical species formed in the plasma are used to etch substrate 124 disposed on holder 126. Substrate 124 can be for example silicon, gallium-arsenide (AsGa) or germanium (Ge). In particular for a silicon substrate, silicon dioxide ($SiO_2$) may be used as an oxide and silicon nitride SiN may be used as a nitride.

Skin depth in a plasma is defined as the depth at which the RF wave is substantially attenuated. It can be otherwise referred to as an evanescent wave. This occurs when the plasma frequency is less than the cut-off plasma frequency. In general when the skin depth of the inductively coupled plasma (ICP) source is small relative to the radius of the chamber, then the cylindrical walls tend to impede the transport of charged species and affect the plasma chemistry control. The skin depth meets this criterion typically when the chamber diameter greatly exceeds the chamber height, as is usually the case when processing large wafers (i.e. 200 to 300 mm and greater). Therefore, in this embodiment where the chamber diameter exceeds the chamber height, cylindrical walls 114A, 114B and 114C play a role in controlling the plasma chemistry.

Similarly, in another embodiment where the diameter of the chamber 104 is approximately the same or less than the chamber height, it is also expected that the cylindrical walls 114A, 114B and 114C significantly affect the ionization locally. Therefore, cylindrical walls 114A, 114B and 114C are suitable for spatially adjusting the ion density by tailoring their length. The wall length provides greater surface area in contact with the plasma and can in some cases produce greater secondary electron emission leading to greater ionization rates locally. Therefore, the critical RF field amplitude, required for plasma production and maintenance, becomes lower near the dielectric surfaces, thus the system with cylindrical dielectric walls could be operated at lower RF power while still being able to generate appreciable level of chemically active radicals and ions.

Figure 2:
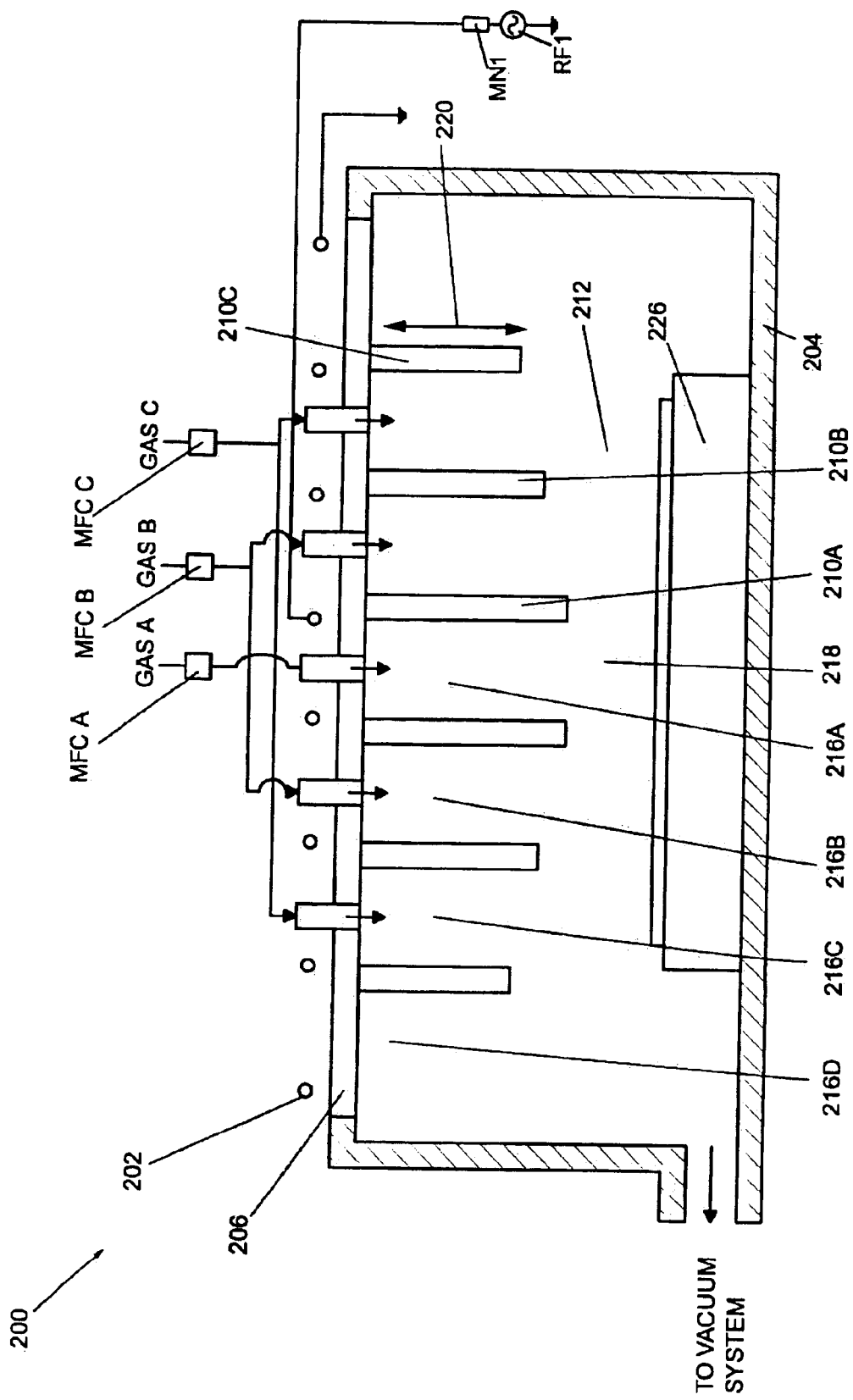
FIG. 2 is a schematic representation of a plasma processing apparatus according to an alternative embodiment of the present invention.

FIG. 2 illustrates a third embodiment showing plasma processing apparatus 200 comprising an inductive coil 202 wound on top of processing chamber 204. In this embodiment, inductive coil 202 is a transformer-type or transformer coupled plasma (TCP) source or pancake/spiral coil. In this embodiment the coils are wound in spiral conformation on top of the processing chamber as shown in FIG. 2. If a TCP-type coil is utilized, a dielectric window (e.g. quartz, alumina, etc.), or even a semiconducting window such as silicon, may be employed to permit the coupling of a RF field through the upper chamber plate 206 to the plasma. Additionally, as described above, a radially slotted, grounded electrostatic shield can be implemented to minimize capacitive coupling between coil 202 and plasma. Similarly, RF power from a RF generator can be coupled to coil 202 through an impedance match network to maximize the transfer of power to the plasma.

As described previously in the first embodiment, the circular upper wall 206 serves also as a cover plate for the vacuum chamber and from the upper wall 206 are appended concentric cylinders 210A, 210B, 210C, each extending a pre-specified depth into the plasma region 212. Similarly to FIG. 1, for the sake of clarity, three cylinders are represented on FIG. 2, however, it is understood any number of concentric cylinders can be used. As shown in FIG. 2, three concentric cylinders 210A, 210B, 210C, with cylindrical walls 214A, 214B and 214C extend from the upper wall into the plasma, hence, defining four regions, namely, regions 216A, 216B, 216C, and 216D. The concentric walls 214A, 214B and 214C may be fabricated from quartz and the wall thickness of the cylinder may vary with length. For instance, the wall thickness may decrease with length such that each annular region increases in its cross-sectional area as one approaches the wafer. The set of concentric cylinders 210A, 210B, and 210C impede the transport of charged species (particularly heated electrons) throughout the processing space 218 and therefore, they partition the process space 212 into four regions 216A, 216B, 216C, and 216D.

This zoning of process space allows for spatial control of the plasma chemistry and can be further augmented, as described previously, by varying the length 220 to which each cylindrical wall extends into the processing space 218. Also as described previously, the set of cylindrical walls partition the plasma chemistry and impede transport in the chamber, and when selected properly can lead to a uniform plasma and reactive chemistry above the wafer. Experiments utilizing design of experiment (DOE) methodologies can lead to the optimum arrangement of cylindrical wall partitions. As described above and in the following, partitioning the plasma region above the wafer enables further tuning of the local plasma and reactive chemistry via adjusting the relative gas flow rates and/or specie(s) partial pressures. Without process gas zoning we simply flow equivalent process gas fluxes and specie partial pressures to all regions (or zones) from a single standard gas supply system as is conventionally done. Furthermore, dielectric wall extensions in the direction of wafer control the plasma density in zones as well as gas and plasma composition therein, in particular, the content of chemically active radicals. An optimal length of dielectric walls varies depending on the process as well as on gas and plasma parameters. Correspondingly, to make the device more universal, the length of the dielectric walls can even be adjustable. Each region, 216A, 216B, 216C, and 216D is, for example, independently fed with precursor gas flow rate and species composition.

In the embodiment of FIG. 2, similarly to the first embodiment shown in FIG. 1, three sources A, B and C of feed gas are used. Gas source A controlled by valve MFC-A feeds region 216A, gas source B controlled by valve MFC-B feeds region 216B and gas source C controlled by valve MFC-C feeds region 216C. This configuration allows for improved control of the plasma in each region by varying the pressure and/or the composition of the feed gas in each of the regions 216A, 216B, 216C, and 216D. As stated above, zoning the gas flow (i.e. flow rate and partial pressures) enables an additional tuning mechanism for adjusting the process uniformity during process changes either in-situ or substrate-to-substrate or batch-to-batch. In summary, the main outcome of this control is the possibility of adjusting and improving process uniformity through the whole area of the substrate. Alternatively, the walls and gas flows can be adjusted to make the process radially non-uniform. Also, as mentioned above, the regions may be supplied with the same gas mix, perhaps from a single source.

Additionally, as mentioned previously, the coil 202, creating the RF field, is wound in spiral conformation on top of the processing chamber. This configuration has the advantage of controlling the plasma in each of the regions 216A, 216B, 216C and 216D. Furthermore, any combination thereof and/or use with capacitively coupled electrodes may be implemented.

Figure 3:
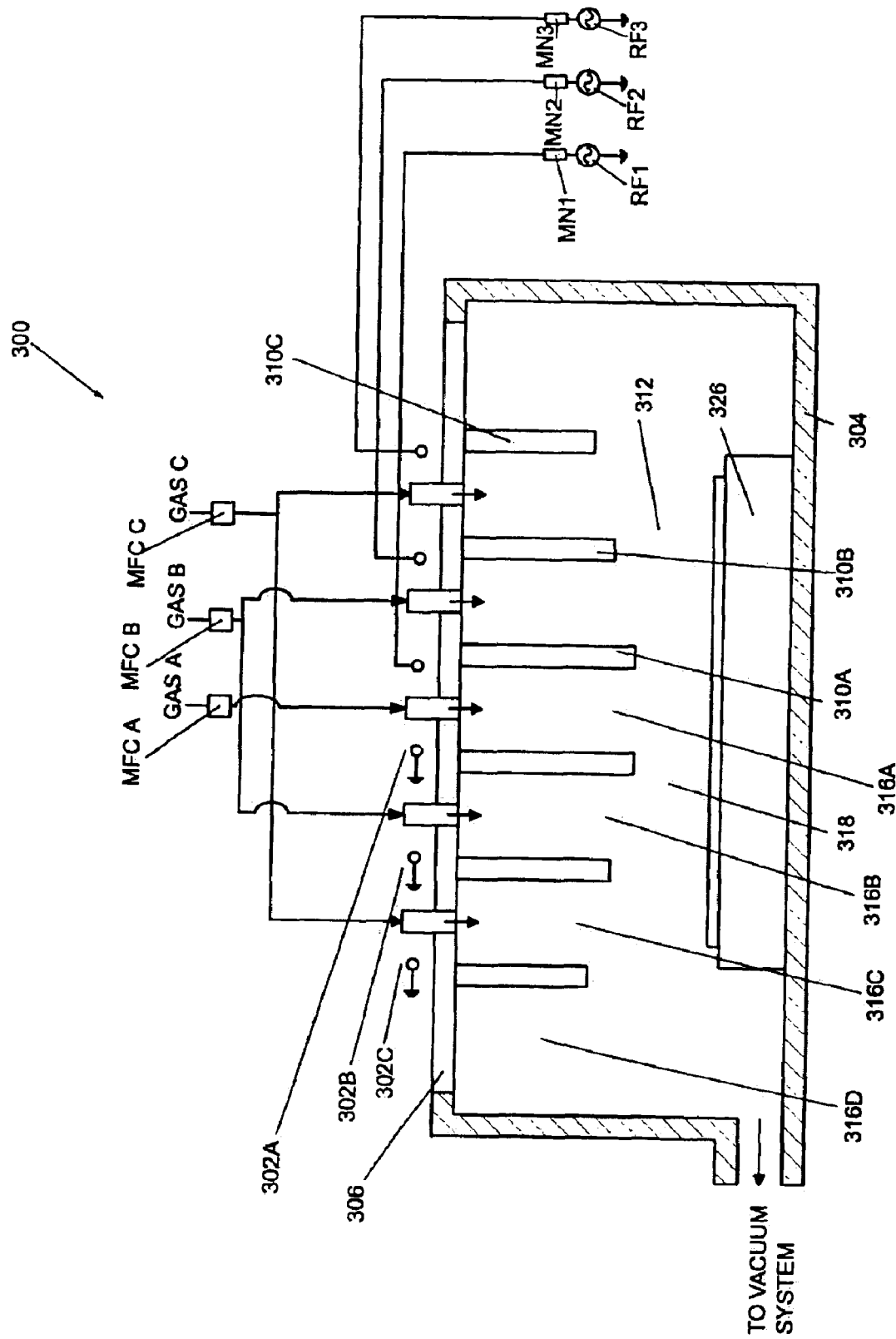
FIG. 3 is a schematic representation of a plasma processing apparatus according to another embodiment of the present invention.
Figure 4:
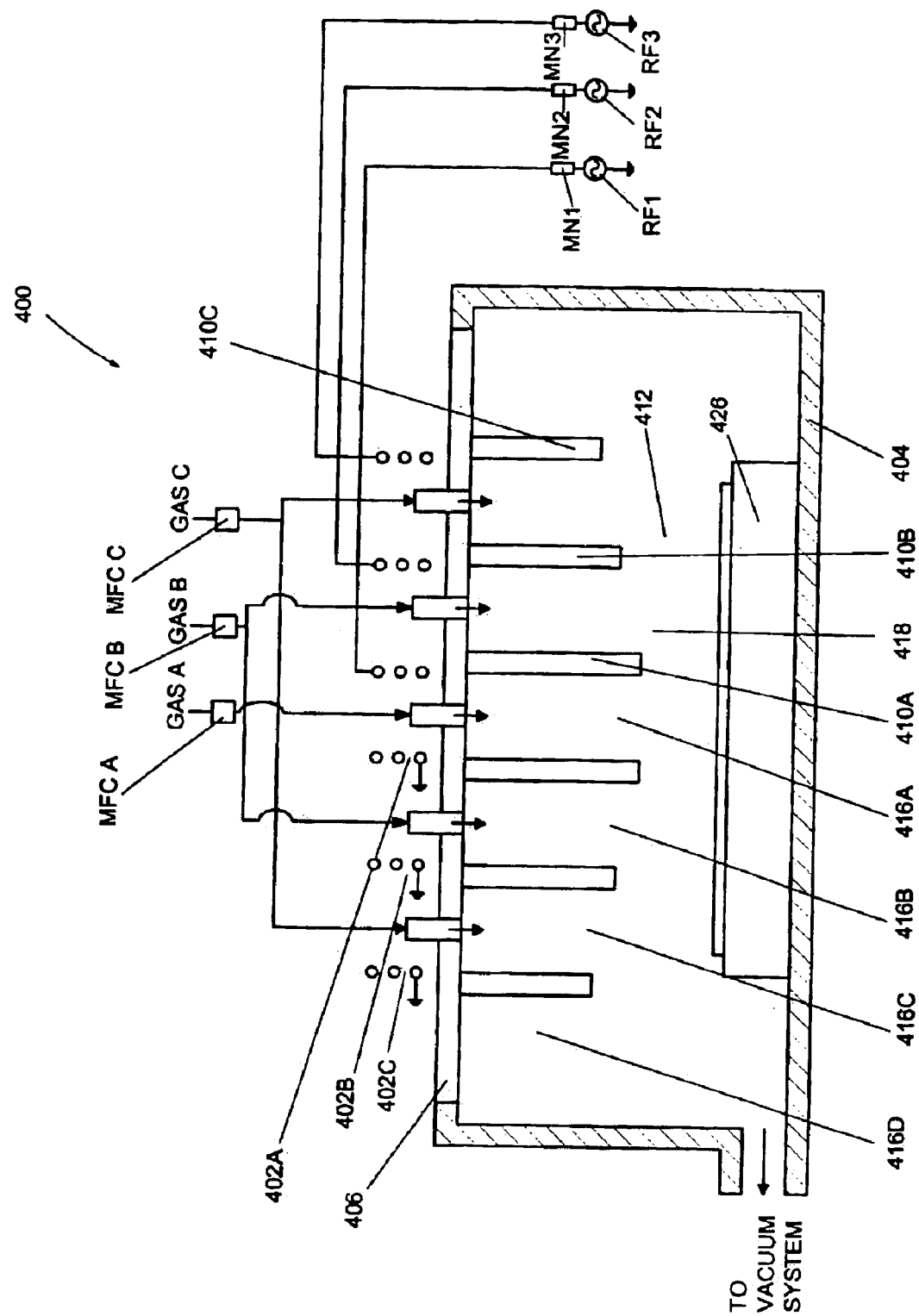
FIG. 4 is a schematic representation of a plasma processing apparatus according to an alternative embodiment of the present invention.

In an alternate embodiment, illustrated in FIG. 3, plasma processing apparatus 300 includes the elements described in the previous embodiment. However, in this embodiment plasma processing apparatus 300 comprises a plurality of inductive coils 302A, 302B and 302C. In this embodiment, inductive coils 302A, 302B and 302C can be a plurality of single turn coils with various geometries, depending on the specificity of each application. Each coil 302A, 302B and 302C can be closely coupled to each plasma region 316A, 316B and 316C, respectively. In another embodiment, illustrated in FIG. 4, single turn inductive coils 302A, 302B and 302C of plasma processing apparatus 300 are replaced by multi-turn inductive coils 402A, 402B and 402C in plasma processing apparatus 400. Similarly to the previous embodiment, each of the multi-turn inductive coils 402A, 402B and 402C can be closely coupled to each plasma region 416A, 416B and 416C, respectively. In any of the embodiments, single or plural coils can be employed with each coil being of single or multiple turns.

In any of the previous embodiments, the set of concentric cylinder partitions can be replaced with partitions of varying cross-section, such as but not limited to, plates. Alternatively, the partitions may be replaced with a bundle of cylindrical tubes with a smaller cross-section. These sections or cylinders may be made of quartz.

While a detailed description of presently preferred embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A plasma processing apparatus for spatial control of dissociation and ionization comprising:

a process chamber:

a plasma generating system configured and arranged to produce a plasma in the process chamber;

a substrate holder configured to hold a substrate during substrate processing;

a gas source configured to introduce gas into the process chamber;

a pressure-control system for maintaining a selected pressure within the process chamber; and a plurality of concentric partitions dividing the internal volume of said process chamber into a plurality of spatial zones;

wherein said partitions extend from a wall of said process chamber toward said substrate holder; and wherein said gas source is operable to independently feed each of said spatial zones with a process gas of variable gas flow rate and species composition.

2. The plasma processing apparatus for spatial control of dissociation and ionization as recited in claim 1 wherein said partitions extend a varying distance into the process chamber.

3. The plasma processing apparatus for spatial control of dissociation and ionization as recited in claim 1 wherein said partitions comprise at least one dielectric material.

4. The plasma processing apparatus for spatial control of dissociation and ionization as recited in claim 3 wherein said dielectric material is selected from the group consisting of silicon carbide, carbon, silicon, quartz and alumina.

5. The plasma processing apparatus for spatial control of dissociation and ionization as recited in claim 1 wherein said partitions are configured to impede the transport of charged species in at least one spatial zone.

6. The plasma processing apparatus for spatial control of dissociation and ionization as recited in claim 1 wherein said plasma generating system comprises at least one radio frequency (RF) coil.

7. The plasma processing apparatus for spatial control of dissociation and ionization as recited in claim 6 wherein said at least one RF coil is arranged around an outer circumference of said process chamber.

8. The plasma processing apparatus for spatial control of dissociation and ionization as recited in claim 6 wherein said at least one RF coil is arranged in a spiral pattern on top of said process chamber.

9. The plasma processing apparatus for spatial control of dissociation and ionization as recited in claim 1 wherein said gases comprise fluorocarbon molecules.

10. The plasma processing apparatus for spatial control of dissociation and ionization as recited in claim 1 wherein said partitions comprise cylindrical shapes disposed concentrically and extending toward the substrate such that a respective length of each successive cylindrical shape is greater toward the center of said substrate.

11. The plasma processing apparatus for spatial control of dissociation and ionization as recited in claim 1 wherein said partitions comprise plates.

12. The plasma processing apparatus for spatial control of dissociation and ionization as recited in claim 1 wherein said partitions comprise cylindrical tubes.

13. A plasma processing apparatus for spatial control of dissociation and ionization comprising:

a process chamber;

a plasma generating system configured and arranged to produce a plasma in the process chamber;

a substrate holder configured to hold a substrate during substrate processing;

a gas source configured to introduce gas into the process chamber;

a pressure-control system for maintaining a selected pressure within the process chamber; and a plurality of concentric cylindrical walls dividing the internal volume of said process chamber into a plurality of spatial zones, wherein said walls extend from a wall of said process chamber toward said substrate holder; and wherein said gas source is operable to independently feed each of said spatial zones with a process gas of variable gas flow rate and species composition.

* * * * *